United States Patent [19]

Rudert, Jr.

[11] Patent Number: 4,816,692
[45] Date of Patent: Mar. 28, 1989

[54] PATTERN SPLICING SYSTEM AND METHOD FOR SCANNING OF ELECTRON BEAM SYSTEM

[75] Inventor: John R. Rudert, Jr., Fishkill, N.Y.

[73] Assignee: International Business Machines Corporation, Armonk, N.Y.

[21] Appl. No.: 71,120

[22] Filed: Jul. 8, 1987

[51] Int. Cl.$^4$ .............................................. G21K 5/00
[52] U.S. Cl. ............................ 250/492.22; 250/492.3; 364/491
[58] Field of Search ............... 250/492.2, 492.2, 492.3; 364/491

[56] References Cited

U.S. PATENT DOCUMENTS

| | | | |
|---|---|---|---|
| 4,099,062 | 7/1978 | Kitcher | 250/492.22 |
| 4,494,004 | 1/1985 | Mauer, IV et al. | 250/492.22 |
| 4,500,789 | 2/1985 | Ban et al. | 250/492.22 |
| 4,523,098 | 6/1985 | Noma | 250/492.22 |
| 4,538,232 | 8/1985 | Koyama | 250/492.22 |

*Primary Examiner*—Carolyn E. Fields
*Assistant Examiner*—John A. Miller
*Attorney, Agent, or Firm*—Graham S. Jones, II

[57] ABSTRACT

A system and an algorithmic method are provided for scanning an electron beam in a predetermined pattern over a surface, which is partitioned into a matrix of sub-fields. The system includes an electron beam, and it determines the boundary portions of that pattern in a selected sub-field of the matrix which extends into the next sequential adjacent sub-fields in the same row and column as the selected sub-field. The coordinates of the pattern boundary portion in the selected and the adjacent sub-fields are stored in a memory. The electron beam scans over the surface for fully exposing the surface with all portions of the predetermined pattern within the selected sub-field, except for the boundary portions. Then the boundary portions in the currently selected sub-field are spliced, i.e. partially exposed, as are the boundary portions of the adjacent sub-fields which extend into the currently selected sub-field. Portions of the spliced data are stored in a buffer for use in computing the data for the corresponding adjacent sub-fields. Then the coordinates of the pattern boundary portions in the previously selected sub-fields are deleted from the memory.

12 Claims, 9 Drawing Sheets

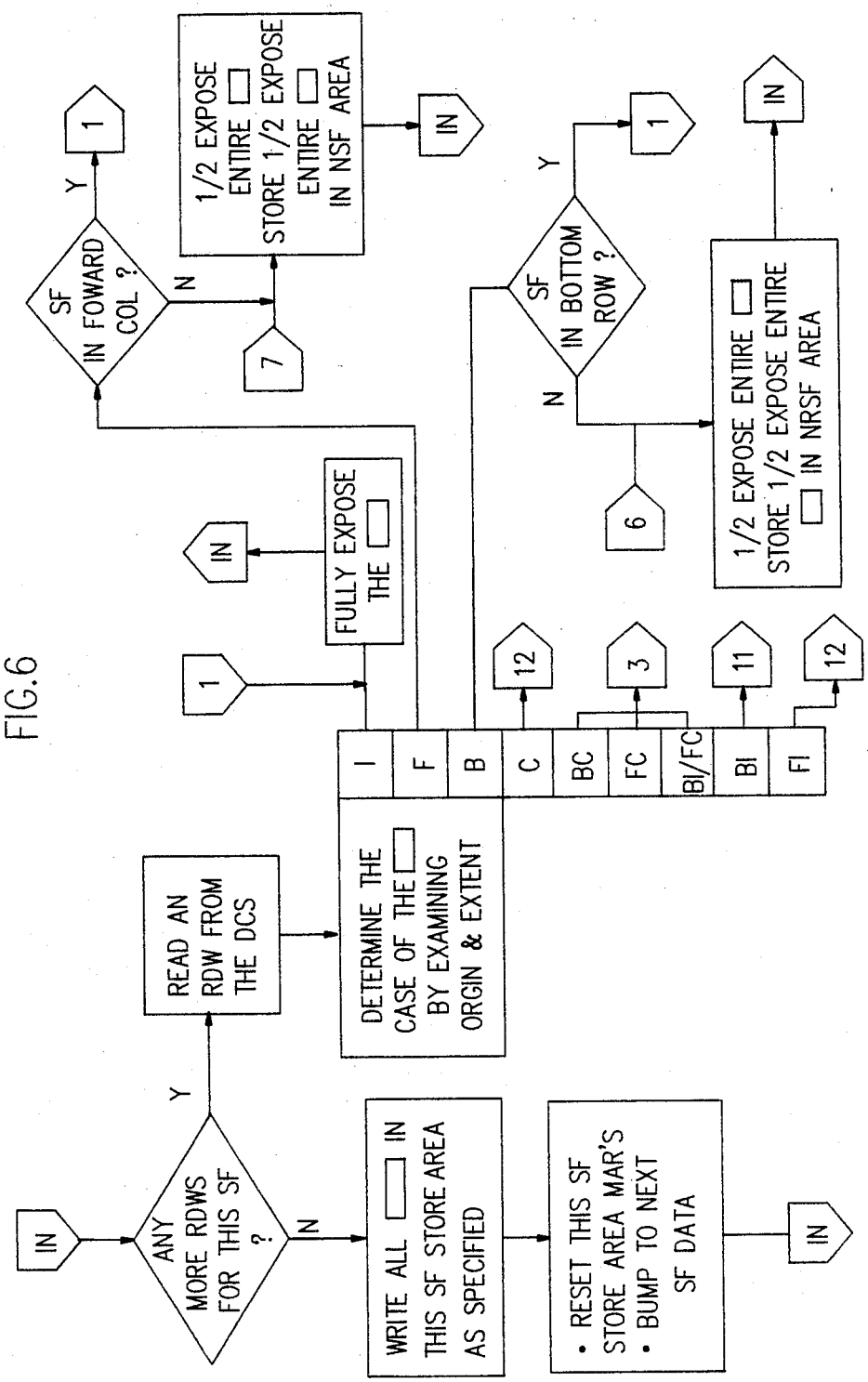

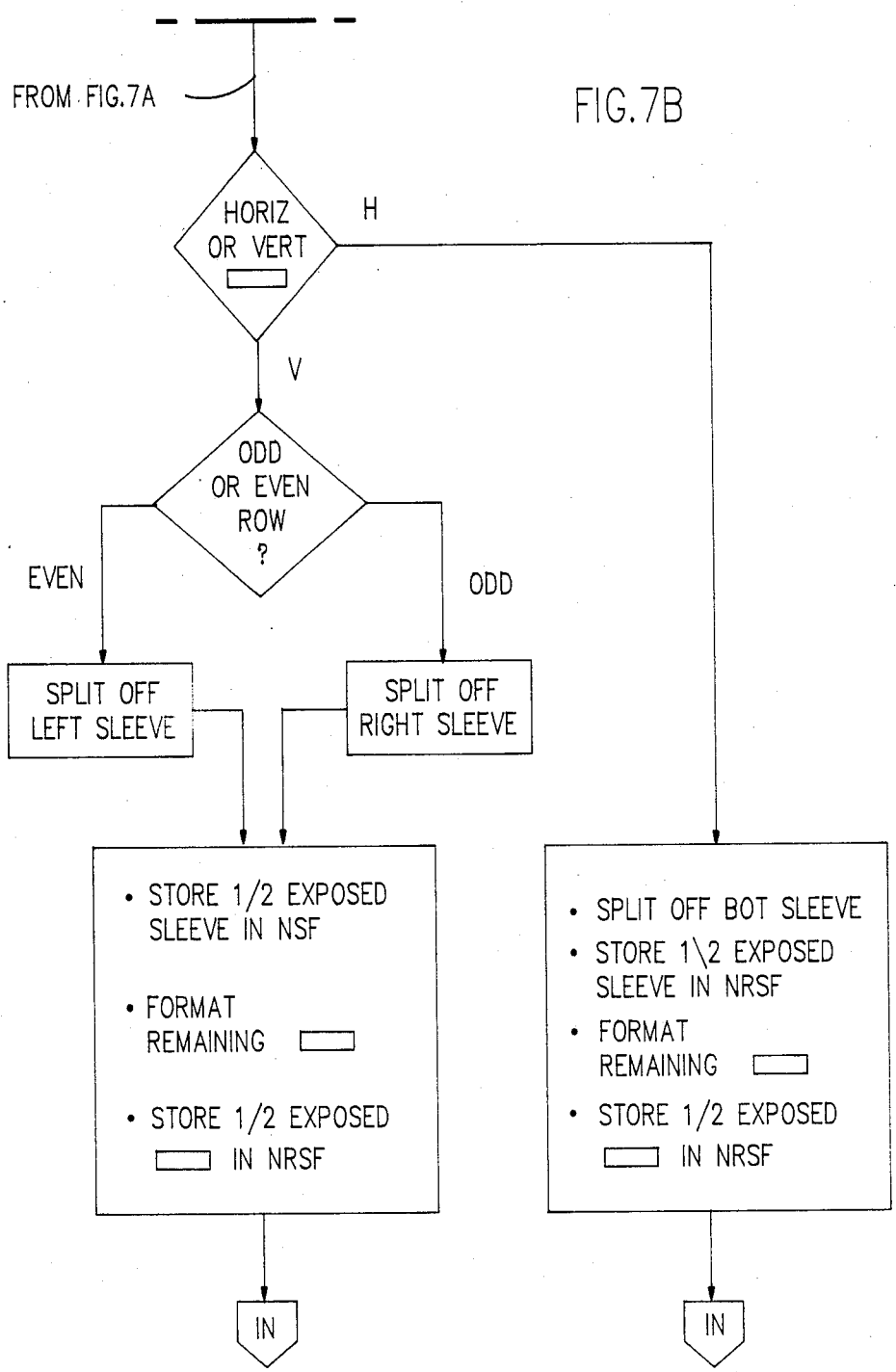

PATTERN SPLICING SYSTEM AND METHOD FOR SCANNING OF ELECTRON BEAM SYSTEM

BACKGROUND OF THE INVENTION

1. Field of the Invention

The present invention relates to scanning an electron beam in a predetermined pattern over a surface, and more particularly to processing the pattern by breaking it into sub-fields.

2. Description of Related Art

U.S. Pat. No. 4,494,004 of Mauer, Michail and Woodard for "Electron Beam System" shows the general concept of dividing areas of a semiconductor wafer upon which patterns are to be written into sub-fields employing a stepped sequential scan such as a raster scan to go from sub-field to sub-field, and employing a vector scan within the sub-field.

U.S. Pat. No. 4,234,358 of Celler et al for "Patterned Epitaxial Regrowth Using Overlapping Pulsed Irradiation" shows edge overlapping of results due to the effect of an energy concentration in the center of the energy beam used. The energy beam can be selected from an ion beam, an electron beam, an incoherent beam and a laser beam.

U.S. Pat. No. 4,099,062 of Kitcher for "Electron Beam Lithography Process" uses overlapping exposures at a reduced rate.

U.S. Pat. No. 4,199,689 of Takigawa entitled "Electron Beam Exposing Method and Electron Beam Apparatus" describes exposing of boundary regions at a reduced spot size with different energy concentrations.

U.S. Pat. No. 4,179,316 of Connors et al, entitled "Method and Apparatus for Heat Treating" describes a system wherein the size and the intensity of the exposure can be programmed to any desired configuration and value.

U.S. Pat. No. 4,219,719 of Frosien et al for "Method and Apparatus for Automatically Positioning a Workpiece Relative to a Scanning Field or Mask" employs careful alignment procedures to correct for misalignment in a charged particle beam apparatus. A limitation with the Frosien et al system is that it requires individual sub-field registrations which both consume time and increase data volume. That process also expends silicon area which could otherwise be used for devices by requiring special registration marks.

U.S. Pat. No. 4,310,743 of Seliger for "Ion Beam Lithography Processes and Apparatus Using Step-and-Repeat Exposure" accommodates lateral wafer distortions in the target and optimizes the resolution, throughput, yield and cost of the process.

SUMMARY OF THE INVENTION

In the past the function of splicing patterns in electron beam systems has been performed in software, which consumed excessive amounts of time. Accordingly, an object of this invention is to provide a hardware system for pattern splicing.

About the periphery of every sub-field is formed an extended sub-field region to splice shapes from adjacent sub-fields without overexposure or underexposure. This is required because of errors which exist in the placement of shapes when written from adjacent sub-fields.

In accordance with this invention, a system is provided for scanning an electron beam in a predetermined pattern over a surface of a workpiece. The surface is partitioned into a matrix of sub-fields. The system includes as follows:

a. an electron beam exposure system including an electron beam, b. means for storing pattern data, c. splicing means for splicing the pattern data to provide spliced pattern data, d. means for operating the electron beam exposure system to expose the spliced pattern data on a workpiece, and e. the exposure system is connected to the output of the means for operating. Preferably, in the above system, the sub-fields include a selected sub-field and adjacent sub-fields located adjacent to the selected sub-field, where the adjacent sub-fields are to be exposed subsequently, and the splicing means includes means for determining the boundary portions of the predetermined pattern and for partitioning and segregating the boundary portion in a selected sub-field of the matrix which extends into the next sequential adjacent sub-fields in the same row and column as the selected sub-field.

Preferably, in the above system, the sub-fields include a selected sub-field and adjacent sub-fields located adjacent to the selected sub-field, where the adjacent sub-fields are to be exposed subsequently, the splicing means includes means for storing the spliced pattern data to be fed forward to the adjacent sub-fields of the pattern boundary portion in the selected and the adjacent sub-fields in a memory.

Another feature for the above system comprises splicing means including means for providing spliced pattern data for scanning the electron beam over the surface of the workpiece to fully expose the surface with all portions of the predetermined pattern within the selected sub-field except the boundary portions. Preferably the above splicing means includes means for providing spliced pattern data for partially exposing the boundary portions in a currently elected sub-field with the pattern data, and partially exposing the boundary portions of adjacent sub-fields which extend into the currently selected sub-field.

Preferably the above system includes a. memory means for storing pattern data representing at least one post processed pattern shape, b. the means for storing pattern data being coupled to the output of the memory means, c. the splicing means including
  (1) means for receiving the pattern data from the means for storing,
  (2) means for determining whether a splicing function is required on the pattern data, and
  (3) output means for preparing the spliced pattern data, d. the means or operating being adapted for receiving the spliced pattern data from the output means and for supplying the spliced pattern data to control exposure with and E-beam system.

In another aspect of this invention, a system is provided for scanning an electron beam in a predetermined pattern over a surface. The surface is partitioned into a matrix of sub-fields. The system includes as follows:

a. an electron beam;

b. means for determining the boundary portions of the predetermined pattern in a selected sub-field of the matrix which extends into the next sequential adjacent sub-fields in the same row and column as the selected sub-field;

c. means for storing the coordinates of the pattern boundary portion in the selected and the adjacent sub-fields in a memory means;

d. means for scanning the electron beam over the surface to fully expose the surface with all portions of the predetermined pattern within the selected sub-field except the boundary portions;

e. means for partially exposing the boundary portions in the currently selected sub-field, and partially exposing the boundary portions of the adjacent sub-fields which extend into the currently selected sub-field; and e. means for deleting from the memory means the coordinates of the pattern boundary portions in the previously selected sub-fields.

In another aspect of this invention, a system is provided for scanning an electron beam in a predetermined pattern over a surface, where the surface is partitioned into a matrix of sub-fields. The sub-fields include boundary portions of the pattern which lie within two or more adjacent sub-fields. The system includes as follows:

a. A feed-forward memory stores the coordinates of the boundary portions of the pattern in a selected sub-field to be partially exposed by the electron beam during the scanning of a subsequently selected sub-field; and b. The coordinates of the boundary portions of the pattern in a previously selected sub-field which extends into the currently selected sub-field are stored.

The result is that the coordinates of the previously selected pattern boundary portions are deleted from the feed-forward memory following the scanning of the currently selected sub-field.

In another aspect of this invention a method is provided for scanning an electron beam in a predetermined pattern over a surface. That surface is partitioned into a matrix of sub-fields.

The method includes the steps as follows:

a. Determine the boundary portions of the predetermined pattern in a selected sub-field of the matrix which extends into the next sequential adjacent sub-fields in the same row and column as the selected sub-field;

b. The coordinates of the pattern boundary portion in the selected and the adjacent sub-fields are stored in a memory;

c. Scan the electron beam over the surface to fully expose the surface with all portions of the predetermined pattern within the selected sub-field except the boundary portions;

d. Partially expose the boundary portions in the currently selected sub-field, and partially expose the boundary portions of the adjacent sub-fields on the surface, which boundary portions extend into the currently selected sub-field; and e. Delete from the memory means the coordinates of the pattern boundary portions in the previously selected sub-fields.

BRIEF DESCRIPTION OF THE DRAWINGS

FIGS. 6, 7, 8 and 9 show flow charts of a preferred hardware embodiment of the logic functions and their sequence which are required to provide the splice scale calculations required by the system described above.

The foregoing and other objects, features and advantages of the invention will be apparent from the more particular description of the preferred embodiments of the invention which follows.

DESCRIPTION OF THE PREFERRED EMBODIMENT

Disclosure of the Invention

Figure 1:
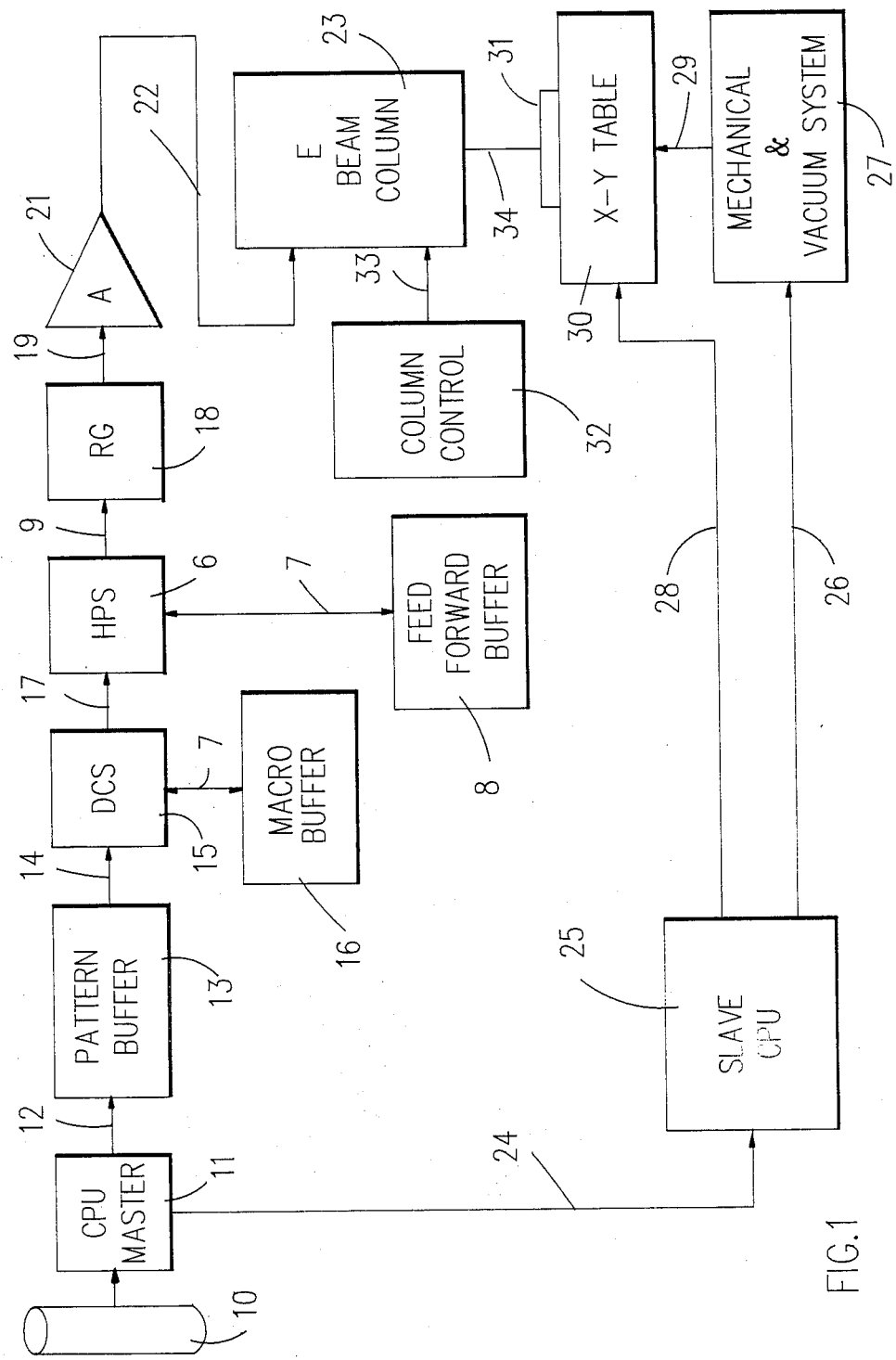
FIG. 1 shows a schematic diagram of a control system and a pattern writing portion of an electron beam exposure apparatus.

FIG. 1 shows a schematic diagram of a control system and an electron beam exposure apparatus. The output of a postprocessor numerical control data processing program is stored on disk 10 attached to CPU 11 which is the Master control for the system. Data bus 12 from the CPU 11 is connected to a pattern buffer 13 for storing several patterns to be processed by the system. The output of pattern buffer 13 connects via bus 14 to a Digital Control System (DCS) 15 coupled to its macro buffer 16. The output of the DCS 15 is supplied via bus 17 to a Hardware Pattern Splicing HPS unit 6 which has a Feed Forward Buffer 8 coupled to HPS unit 6 by bus 7. Buffer 8 contains the feed forward buffer memory shown in FIGS. 10 and 13, and the NSF feed forward storage memory shown in FIG. 12. The output of the HPS unit 6 is connected by bus 9 to rectangle generator circuit 18. The rectangle generator 18 passes its output via bus 19, amplifier 21, and lines 22 to the deflection circuits of an E-beam system as described in Chang & Waldman "A Computer-Controlled Electron-Beam Machine for Microcircuit Fabrication", IEEE Transactions on Electron Devices, pp. 629–635, (May 1972). The CPU 11, also acting as a master computer in a master-slave relationship, connects through bus 24 to drive a slave processor CPU 25 as the slave using the post processed data from disk 10 to control the slave processor 25. The slave processor 25 sends control data via line 26 to mechanical and vacuum system control unit 27 which has an output 29 connected to the X-Y control table 30, which supports a wafer 31. The slave also sends X-Y positioning information on bus 28 to the X-Y table 30.

Figure 2:
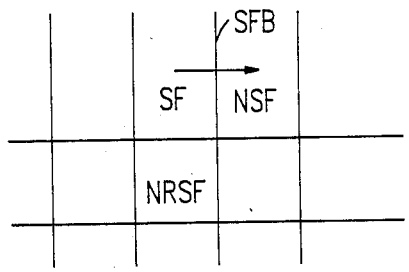
FIG. 2 shows a array of sub-fields in a grid with a Sub-Field (SF), the Next Sub-Field (NSF) and the Next Row Sub-Field (NRSF).

The writing of patterns herein is based upon the techniques described in U.S. Pat. No. 4,494,004 of Mauer et al for "Electron Beam System." In accordance with that technique, the writing field for the electron beam is divided into a number of overlapping Sub-Fields (SF) with a predetermined periodicity. Herein as shown in FIG. 2, we assume that the beam is moving from left to right from sub-field (SF) to the Next Sub-Field (NSF). Below the Sub-Field (SF) is the Next Row Sub-Field (NRSF). The sub-fields in FIG. 2 have the data for each calculated for the immediate (ith) Sub-Field (SF) first. The second sub-field for which a calculation is required Sub-field i+1 is referred to herein as the Next Sub-Field (NSF). Assume now that the beam moves to the NSF position from the SF position. Now the sub-field NSF becomes the SF and the square to the right becomes the NSF and sub-field below it becomes the NRSF.

Figure 3:
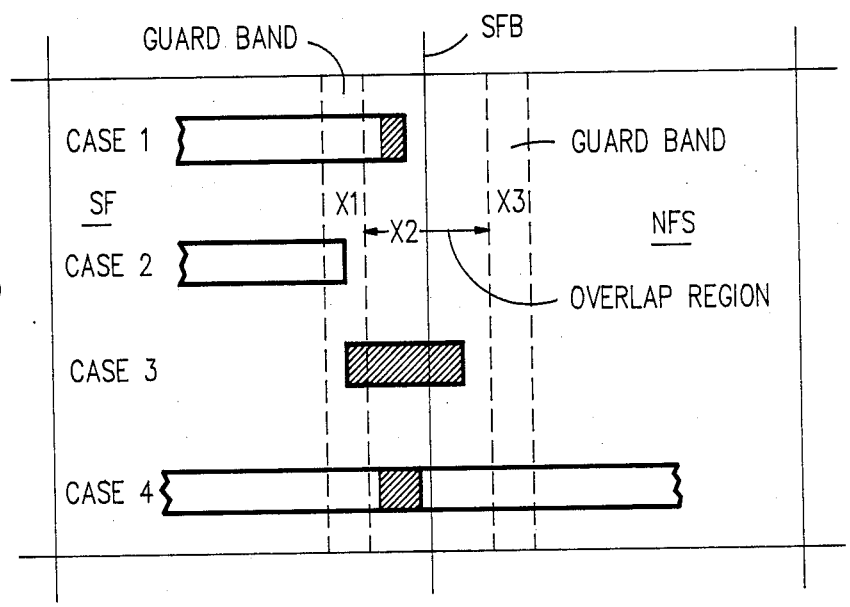
FIG. 3 shows pattern splicing of the patterns which overlap a number of sub-fields, with sub-fields SF and NSF separated by sub-field boundary SFB illustrating four cases of different rectangles and their relationship with the sub-field boundary. Writing of an overlapping portion of a pattern to be spliced is performed at reduced intensity in accordance with this invention.

Referring to FIG. 3, splicing of the patterns which overlap a number of sub-fields is illustrated with sub-fields SF and NSF (separated by a sub-field boundary (SFB). FIG. 3 illustrates the cases of four different rectangles and their relationship with the sub-field boundary SFB.

In Case 1, the rectangle extends across a guard band X1 into boundary zone X2. The technique employed by the algorithm in this case is to split off the last "portion" of the rectangle, which is shaded, and to write it at reduced intensity from both sub-fields SF and NSF. That means that this last "portion" will be included in rectangles which are formed by the system in the processing of each sub-field SF. This involves an overlap which will overcome possible alignment errors between shapes in the SF and NSF sub-fields in accordance with the algorithm of this invention.

For the rectangle in Case 2 which is confined to sub-field SF which rectangle just reaches into guard band Y1, no splicing is performed, since no rectangles spliced from the NSF will extend into guard band X1. This is assured by the post processing of the input data.

In Case 3, the entire rectangle, which extends across the boundary SFB, is confined to the guard band X1 and boundary zone X2 so the entire rectangle is included as if it were a part of both sub-field SF and sub-field NSF and the entire area is spliced, as illustrated by the shading.

For Case 4, the rectangle extends from sub-field SF across the guard band X1, boundary zone X2 including the boundary SFB and the guard band X3 into the Next Sub-Field NSF. Here the post-processor program splits the rectangle near the SFB. The left hand rectangle is handled the same way as Case 1 above was handled. The right hand rectangle is exposed at full intensity from the NSF.

Figure 11:
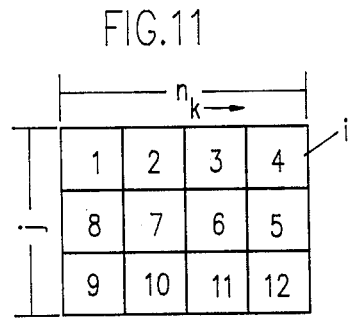
FIG. 11 is a chart representing twelve sub-fields which are to be scanned sequentially in accordance with this invention.

Referring to FIG. 2, and FIG. 11, pattern splicing is done only in the top trailing sub-field (trailing sub-field for scanning from left to right and top to bottom) in any group of four sub-fields.

The NSF sub-field number is i+1 and the NRSF number is i+1+2(nj−i) where the ith SF is the one currently being written in the jth row and kth column, and n is the number of columns in the SF array being written.

The splicing system in accordance with this invention presents the splice shapes from previous sub-fields SF to the Rectangle Generator after the normal shapes from the pattern buffer and the DCS have been written.

The splicing hardware will manage its memory such that the space used for splicing shapes from previously written sub-fields can be reused for future sub-fields, as will be understood by those skilled in the art.

Figure 4:
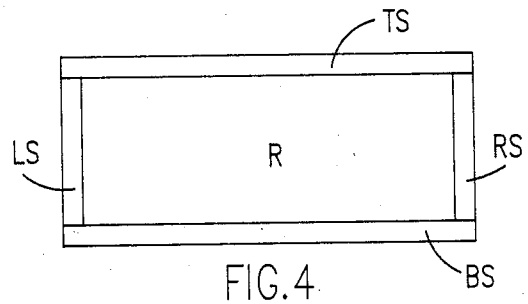
FIG. 4 shows a horizontal rectangle with sleeves to be split off about the periphery of the rectangle for processing.

FIG. 4 shows a horizontal rectangle with sleeves to be split off about the periphery of the rectangle for processing. There are four sleeves about the periphery of the rectangle in FIG. 4. They are the Top Sleeve TS, Right Sleeve RS, Bottom Sleeve BS, and Left Sleeve LS. The sleeves are used for the splicing of shapes larger than the minimum spot size. The method for performing these steps is described below in connection with FIGS. 6, 7, 8 and 9.

Figure 5:
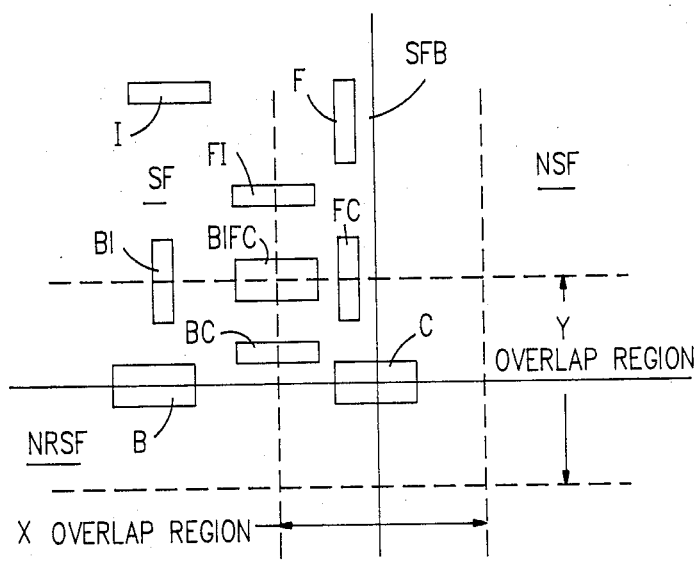
FIG. 5 shows a complete set of cases of rectangles which can be classified into different cases relative to the current sub-field SF. Each rectangle is classified according to where it falls relative to the boundary lines in FIG. 5.

FIG. 5 shows a set of cases of rectangles which can be classified into different cases relative to the current sub-field SF. Each rectangle is classified according to where it falls relative to the boundary lines in FIG. 5. Thus, an analysis is made of each rectangle to see where it overlaps sub-field and margin boundaries in the interior, forward, corner and bottom locations. The nine different rectangle locations which are possible are referred to as cases. The case can be as follows:

Interior (I) case as illustrated by the Interior rectangle I which is located entirely within the interior of the current Sub-Field SF.

Forward (F) case (in a boustrophedontic path-writing of alternate lines in opposite directions analogously to the turning of the oxen at the ends of rows in plowing) is illustrated by the rectangle F located in the X overlap region between the current sub-field SF and the Next Sub-Field NSF.

Bottom (B) case is illustrated by the rectangle B located in the Y overlap region between the current Sub-Field SF and the Next Row Sub-Field NRSF.

Corner (C) case is illustrated by a rectangle located at the intersection of the margins X and Y where they overlap between the SF, NSF and NRSF. Rectangle C illustrates the Corner (C) case.

In addition one can have the various combinations of I, F, C, and B cases as illustrated by the rectangles labelled.

BC-bottom corner,
FC-forward corner,
BIFC-bottom, interior, forward, corner;
BI-bottom, interior; and
FI-forward interior.

FIGS. 6, 7, 8 and 9 show flow charts of a preferred hardware embodiment of the logic functions and their sequence which are required to provide the splicing required by the system described above. The flow charts are appropriate for use in a special purpose computer in a hardware form or, alternatively, if desired, in a general purpose computer in software form. In either case, the computer is connected in the system described above, and the function if performed in the Hardware Pattern Splice (HPS) unit.

The HPS unit includes an RDW Data Register RDWDR (not shown) for receiving a Rectangle Definition Word RDW to be considered currently by the HPS.

At the input Offpage Connector symbol marked IN, in FIG. 6 the first logic function of the hardware pattern splicer 6 of FIG. 1 is to check whether any more Rectangle Definition Words RDW's for this sub-field (SF) exist in the pattern buffer of the DCS 15. This logic function responds to the system with a YES or NO answer. (The offpage connector is employed in many cases there to reduce the amount of wiring and eliminating crossovers and long lengths of connections.)

Any More Rows for This SF? No.

If the response to the inquiry as to whether there are any more RDW's is no, then the HPS system 6 writes all rectangles in this sub-field SF which were stored in a buffer or other storage area as passed (or fed forward from previous sub-fields. What this means is that the passed rectangles are ready to go to the rectangle generator RG 18, without modification, having been generated by data from previously exposed sub-fields so the RDW stored in a RDWDR (Rectangle Definition Word Data Register), i.e. memory 103 in FIG. 10 and FIG. 13, and memory 120 in FIG. 12, by the HPS 6 is supplied to the output buffer of the HPS 6 for supply to the RG 18. Next the HPS resets the feed forward sub-field SF store area Memory Address Registers (MAR's), and the DCS 15 moves to the next sub-field to be exposed.

Any More Rows for This SF? YES.

If there is more RDW data to expose, then the next step is to read an RDW from the pattern buffer via the Digital Control System, DCS 15 in FIG. 1. The rectangle to be generated must be analyzed to determine where it falls within the sub-fields and the pattern splicing areas between the sub-fields. This process is referred to as "determining the case of the rectangle." That is the next step.

The nine different sub-field configurations which are possible are referred to as cases, as explained above. These terms are repeated here, since the cases are central to the algorithm described below.

To review, the case can be the Interior (I) case, the Forward (F) case, Bottom (B) case or the Corner (C) case. In addition one can have the cases of the various combinations including BC-bottom corner; FC-forward corner, BIFC-bottom, interior, forward, corner; BI-bottom, interior; and FI-forward interior. Those blocks are shown as tests which are performed by the testing of the case with outputs as indicated. These cases will be described in greater detail below.

CASE LOGIC

Figures 14, 15, 16:
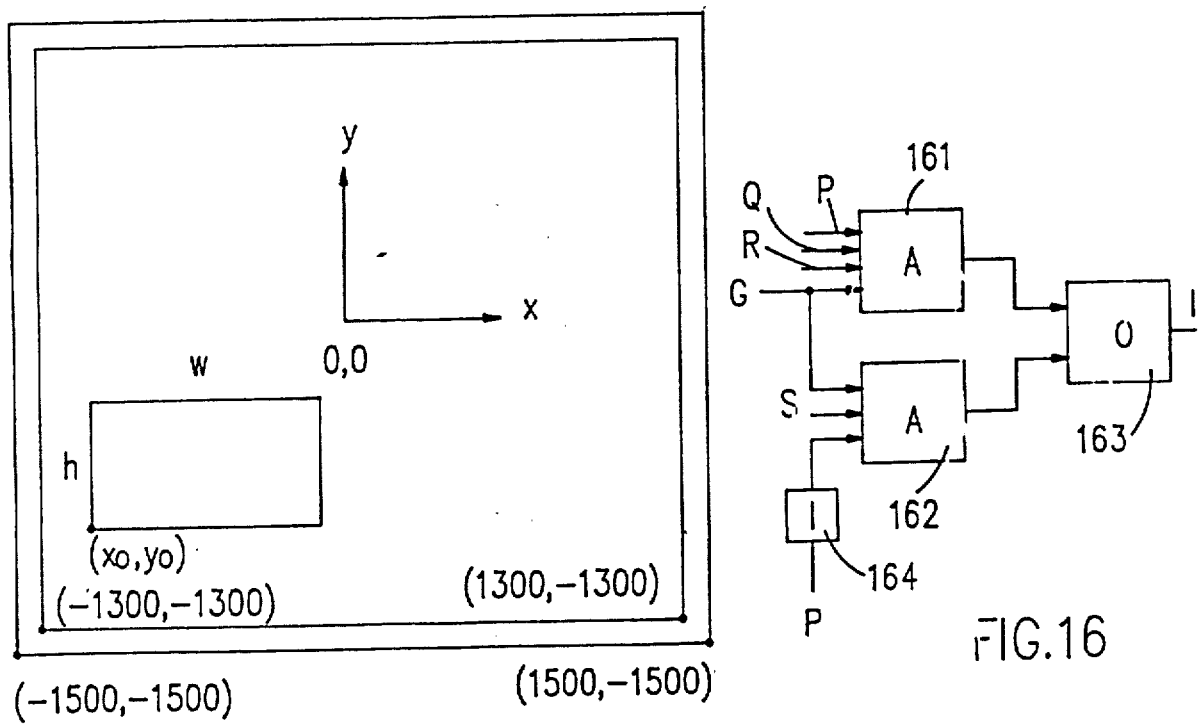
FIG. 14 shows a case logic table for the various cases of the rectangle as illustrated in FIG. 5 and discussed above.
FIG. 15 shows a Sub-Field Coordinate system which is square with the origin at the center of the coordinate system.
FIG. 16 shows an exemplary AND circuit, OR circuit and Inverter logic embodying the table of FIG. 14.

The case logic is shown in FIGS. 14 and 15. The various tests are made on the general rectangle for location of the origin and the extent. Then the logic of FIG. 14 is executed to determine the case. In FIG. 15, a typical rectangle is shown in a sub-field which is the larger square with dimensions of 3000 tool units square. A margin $X_2$ of 200 hundred units is provided around the periphery of the square leaving an inner square having dimensions of 2600 units square. The origin is shown as 0,0. Thus the lower left corner is located at $x = -1300$, $y = -1300$ and the lower right corner of the inner square is located at $x = 1300$, $y = -1300$. The typical rectangle has its lower left corner located at $x_o$, $y_o$, with the rectangle having a height (h) and a width (w). Referring to FIG. 14 for example, the case is "I", if we are in an odd row, and $x_o$ and $x_o + w$ are both less than 1300 units and $y_o$ is greater than $-1300$ units, so that columns P, Q, R in the first row of the x tests matrix, are all positive and row G in the y tests matrix is positive in its first column. The 1's all intersect at the I case under those circumstances. That is, columns PQR and row G are all ANDed together for the odd row case. For the even row case, Column S is combined with the inversion of column P and row G. Thus if S is positive with $x_o > -1300$, and G is positive with $y_o > -1300$, while the case is not 1, or the inverse of P is ANDED. Thus in FIG. 16, the AND and OR logic for the I case is shown, along with the Boolean equation from which it is derived. The cases for the other eight conditions are computed analogously as will be obvious to those skilled in the art who are familiar with Boolean algebra, and matrix tables. This is discussed in further detail below.

INTERIOR SUB-FIELD

If the case is the interior sub-field I, then the next step is to direct the RDW stored in the RDWDR (Rectangle Definition Word Data Register) to the RG 18 (Rectangle Generator) stage to fully expose the rectangle immediately.

Then the next step is to return the program to IN which is the initial step in the program described above. Thus, the next RDW is now to be processed.

FORWARD CASE

Thus, as stated, after the interior case I, returning the program to IN, assume that for the subsequent RDW (which now becomes the current RDW) that the case is F or Forward, which means that the rectangle in question extends into the extended sub-field area $X_1$, $X_2$, $X_3$ in FIG. 3 in the forward direction of scan of the E-beam beyond the boundary of the sub-field in question.

The situation is that there is an RDW for this sub-field which will read the RDW from the DCS and the case will be determined to be F (Forward). Then a decision must be made as to whether the sub-field is in the forward column. Depending upon whether one is moving to the right or the left, the decision is reversed, but the decision is basically the same.

YES: If Yes, then the result is to move along in the program via the offpage connector 1, which leads to the function "FULLY EXPOSE THE RECTANGLE", which was described above as output of case I.

NO: If the test for the "SF in forward column" is answered "NO", then the system exposes the entire rectangle at reduced intensity; and then stores the entire reduced intensity rectangle in the NSF (Next Sub-Field) buffer 120 in FIG. 12.

The next step is to return to IN. Next, we will consider what would happen if the case is B (Bottom) which indicates that the rectangle being considered is located in the Y overlap region in FIG. 5 between the current sub-field SF and the lower adjacent sub-field NRSF which is located directly below the current sub-field.

BOTTOM CASE

IS SUB-FIELD (SF) IN BOTTOM ROW?

The next step is to test whether the sub-field is in the bottom row.

YES: If Yes, then the system proceeds from the offpage output 1 connector to the offpage input 1 (FIG. 6) connector leading to full exposure of the rectangle, as in the INTERIOR CASE.

NO: If the bottom case test results in a NO answer, proceed to the next step.

HALF EXPOSE ENTIRE RECTANGLE AT REDUCED INTENSITY

The next step is to half expose the entire rectangle at a lower E-beam Intensity.

STORE IN NRSF

Figure 13:
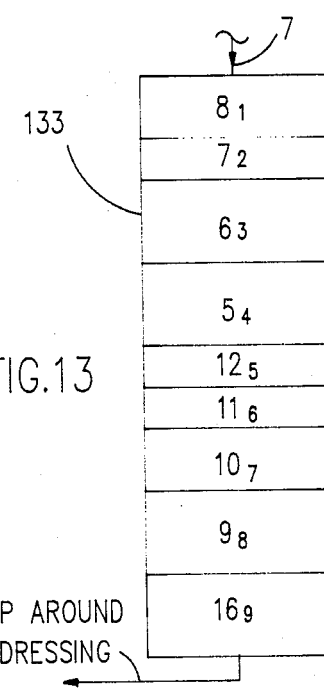
FIG. 13 shows the sequence of the NRSF rectangles stored in the feed forward buffer memory of FIGS. 1 and 10.

Next, the entire rectangle just exposed is stored in the Next Row Sub-Field (NRSF) area buffer 133 in FIG. 13.

Next the system returns to the "IN" offpage input connector.

Now we will consider what happens in the C (CORNER) case.

CORNER

The corner C is the forward bottom location of the extended sub-field. The flow chart for this sequence is shown entirely in FIG. 7 since the algorithm involved is rather extensive.

SF IN BOTTOM FORWARD POSITION?

Figure 7A:
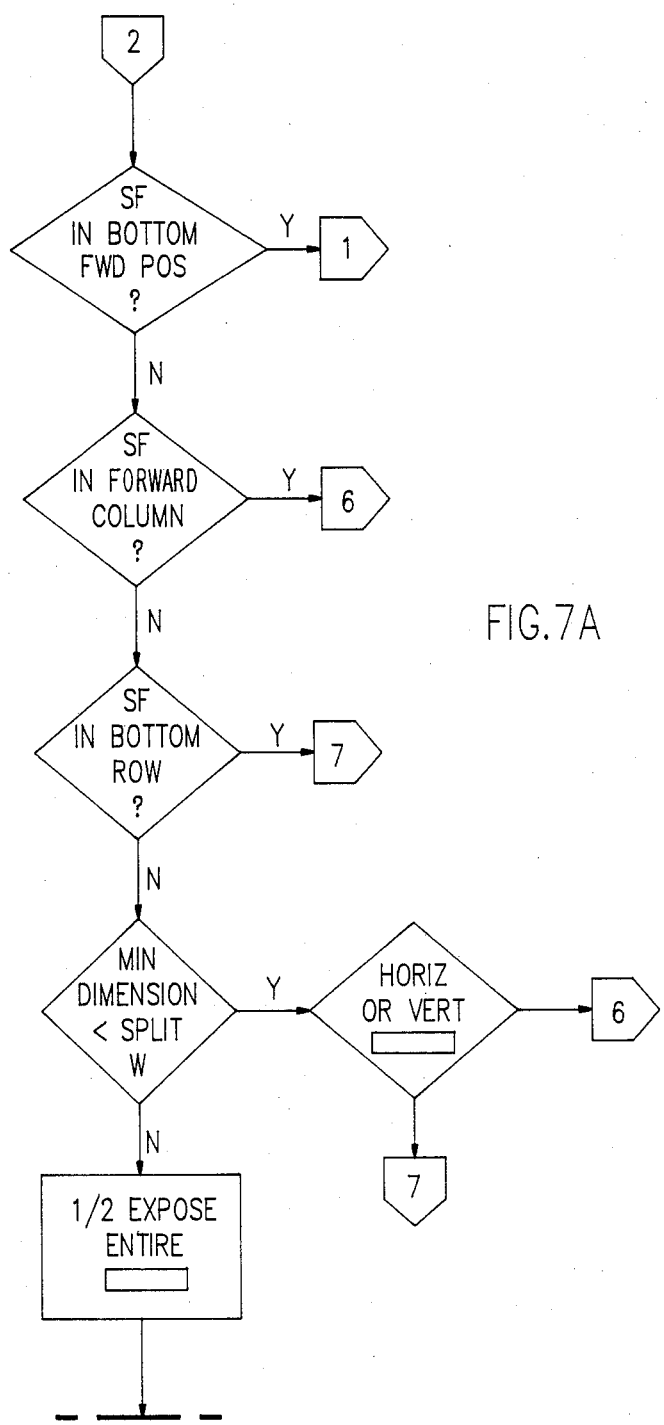

The first test in FIG. 7 is to determine whether the sub-field is in the bottom forward position, i.e. in the bottom corner of the entire pattern.

YES: If Yes, return to offpage connector input 1 in FIG. 6 to fully expose the rectangle.

NO: If NO, then pass to the next test.

The next decision is "Is the sub-field SF in forward column?" That is, is the sub-field located at the end of a row?

YES: If YES, then the, program branches to offpage connector input 6 in FIG. 6.

NO: If NO, then the system continues to the next test in FIG. 7.

The next test is the decision "Is the SF in bottom row?"

YES: If the answer is YES, the program branches to offpage connector input 7 in FIG. 6.

NO: If the answer is NO, the algorithm continues in FIG. 7, as follows, next below.

TEST FOR MINIMUM DIMENSION LESS THAN SPLIT WIDTH?

The next step shown in FIG. 7 is to test for the decision "Is the minimum dimension less than the split width W?" where a rectangle can be split to form sleeves.

YES: If it is too narrow, then no sleeves can be split. If the answer is YES, then a decision block labelled "Horiz or Vert rectangle?" indicates that a test for a horizontal H or vertical V rectangle is made to determine which sleeves to split. If the split is less than the minimum in the vertical direction, the algorithm branches to offpage connector 7 in FIG. 7. If the split is less than the minimum in the horizontal direction, then the branch is to offpage connector 6 in FIG. 7.

NO: If the split is not too narrow, then the algorithm continues to half expose the entire rectangle.

HORIZONTAL OR VERTICAL

Next, referring to FIG. 7, the algorithm tests whether the rectangle is horizontal or vertical.

VERTICAL: ODD OR EVEN ROW?

If the rectangle is vertical, then the next step in the program is to test for an odd or an even row.

SPLIT OFF RIGHT SLEEVE

If the row is odd, the system splits off a right sleeve.

SPLIT OFF LEFT SLEEVE (a) If the row is even the system splits off a left sleeve.
(b) In either case, the next step in the program, as shown in FIG. 7, is to Store the result.

STORE HALF EXPOSED SLEEVE AND FORMAT AND STORE REMAINDER (a) The half exposed sleeve is stored in the Next Sub-Field (NSF) Register 120.
(b) The remaining rectangle is formatted. That half exposed rectangle value is stored in the Next Row Sub-Field (NRSF) Register 133.

RETURN TO IN

The next step is to return to IN and proceed with the next RDW in FIG. 7.

HORIZONTAL

In the case of the last test for horizontal or vertical rectangles, if the result was a horizontal rectangle, then the sleeve to be split is on the bottom of the rectangle.

SPLIT OFF BOTTOM SLEEVE

Accordingly, the bottom sleeve is split off the rectangle.

STORE HALF EXPOSED SLEEVE IN NRSF

Then the half exposed sleeve remaining is stored in the Next Row Sub-Field (NRSF) Register 133 in FIG. 13 to be "thrown over the fence" to the row below.

FORMAT REMAINING RECTANGLE

Next, the remaining rectangle is formatted.

STORE HALF EXPOSED RECTANGLE IN NSF

Figure 12:
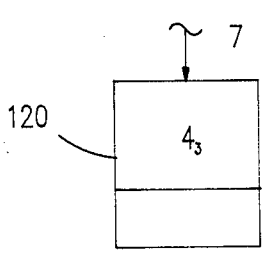
FIG. 12 illustrates the NSF feed forward storage memory which stores the rectangle to be supplied for the Next Sub-Field NSF.

Next the program shown in FIG. 7 stores the half exposed sleeve in the Next Sub-Field Register (NSF) Register, (feed forward rectangle memory 120 in FIG. 12.

At this point the algorithm returns to IN in FIG. 6.

CASES BOTTOM CORNER (BC), FORWARD CORNER (FC), OR BOTTOM-INTERIOR-FORWARD-CORNER (BIFC)

If the case is BC, FC OR BIFC then the offpage connector 3 leads to FIG. 8, which is discussed next.

IS SUB-FIELD IN BOTTOM FORWARD POSITION?

In this step the algorithm looks to see whether the sub-field (SF) is in the bottom forward position.

If YES then the system branches to offpage connector 1 in FIG. 6.

If NO, then the next test follows.

IS SUB-FIELD IN FORWARD COLUMN?

In this test, if the result is YES, the next test is for the vertical dimension.

IS VERTICAL DIMENSION LESS THAN SPLIT WIDTH?

YES: In this test, if the vertical dimension is less than the split width, then the system branches to offpage connector 6 in FIG. 6.

NO: If the answer is NO, then the system branches to offpage connector 8 in FIG. 9, which will be discussed in connection with the description of FIG. 9.

SUB-FIELD IN BOTTOM ROW?

Figure 8:
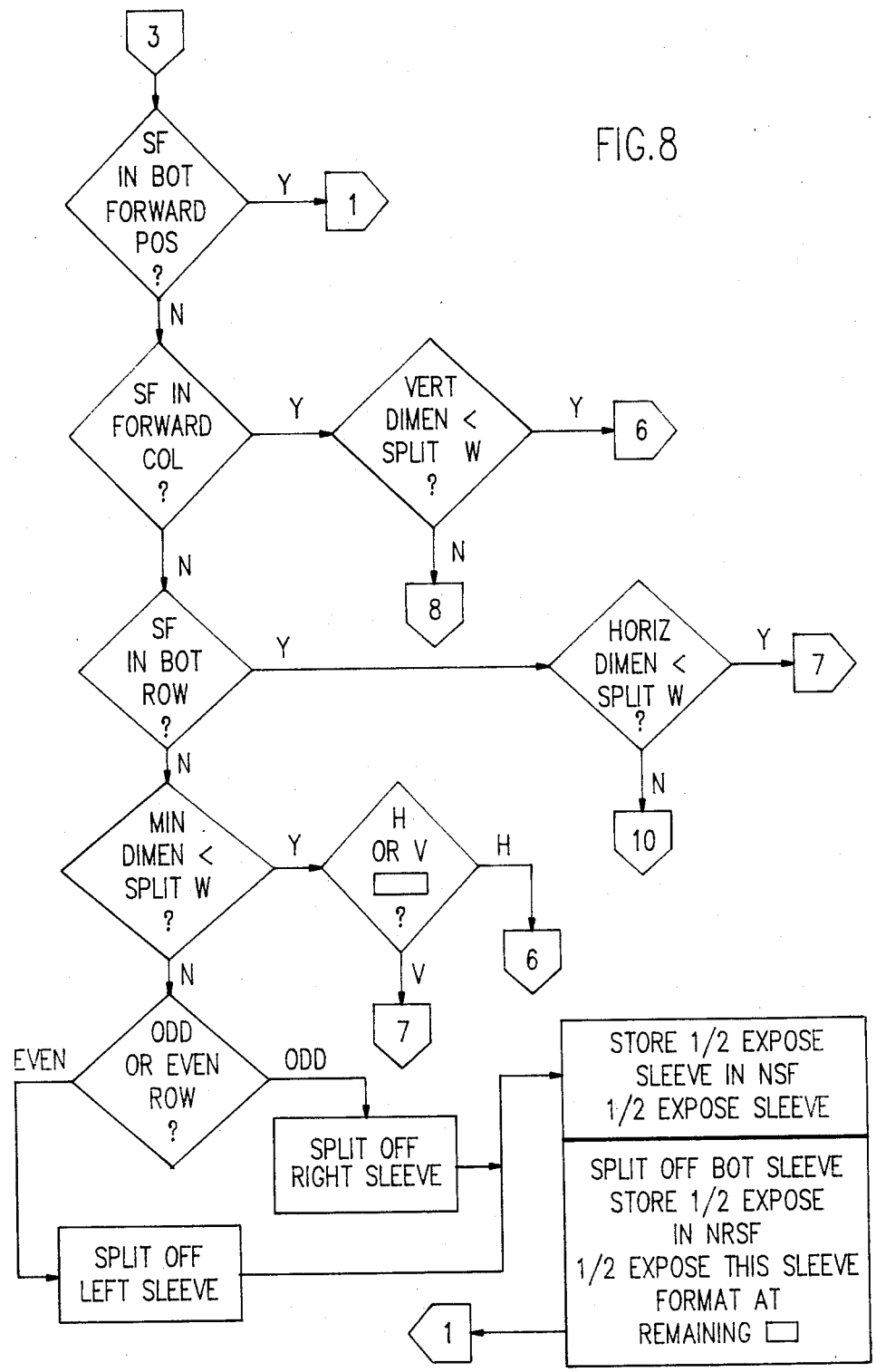

Returning to the previous test shown in FIG. 8, if the sub-field is not in the forward column (NO), then the test is to determine whether the sub-field is in the bottom row.

YES: HORIZONTAL DIMENSION LESS THAN SPLIT WIDTH?

A test is made to determine whether the rectangle needs to have sleeves split in the horizontal direction (Y margin).

YES: In this test, for an affirmative answer, the result is for the program to branch to offpage connector 7 in FIG. 6.

NO: For a NO answer, the result is to branch to offpage connector 10 in FIG. 9.

NO: If the Sub-field is not in the bottom row, then the next test follows which tests for minimum dimension as compared with the split width.

MINIMUM DIMENSION LESS THAN SPLIT WIDTH?

YES: If the answer is YES for this test, then the next test is for a horizontal or vertical rectangle.

HORIZONTAL: If the answer is HORIZONTAL, the system branches to offpage connector 6 in FIG. 6.

VERTICAL: If the answer is VERTICAL, the system branches to offpage connector 7 in FIG. 6.

NO: If the answer is NO for this test, the system proceeds next to test for an odd or an even row.

ODD OR EVEN ROW?

ODD: SPLIT OFF RIGHT SLEEVE.
EVEN: SPLIT OFF LEFT SLEEVE.

Regardless of whether the result was odd or even, proceed to the next step, which is identical in either case

STORE HALF EXPOSED SLEEVE IN NSF

The next step in the program as shown in FIG. 8, after splitting off either a left sleeve or a right sleeve, is to store the resulting data in the Next Sub-Field (NSF) memory 120 in FIG. 12.

The steps which ensue are listed as follows:
HALF EXPOSE SLEEVE.
SPLIT OFF BOTTOM SLEEVE.
STORE HALF EXPOSED SLEEVE IN NRSF BUFFER MEMORY 133 IN FIG. 13.
HALF EXPOSE THIS SLEEVE.
FORMAT REMAINING RECTANGLE.

The remaining rectangle is now formatted and the system branches to the offpage connector 1 in FIG. 6.

BOTTOM INTERIOR (BI) CASE

Figure 9:
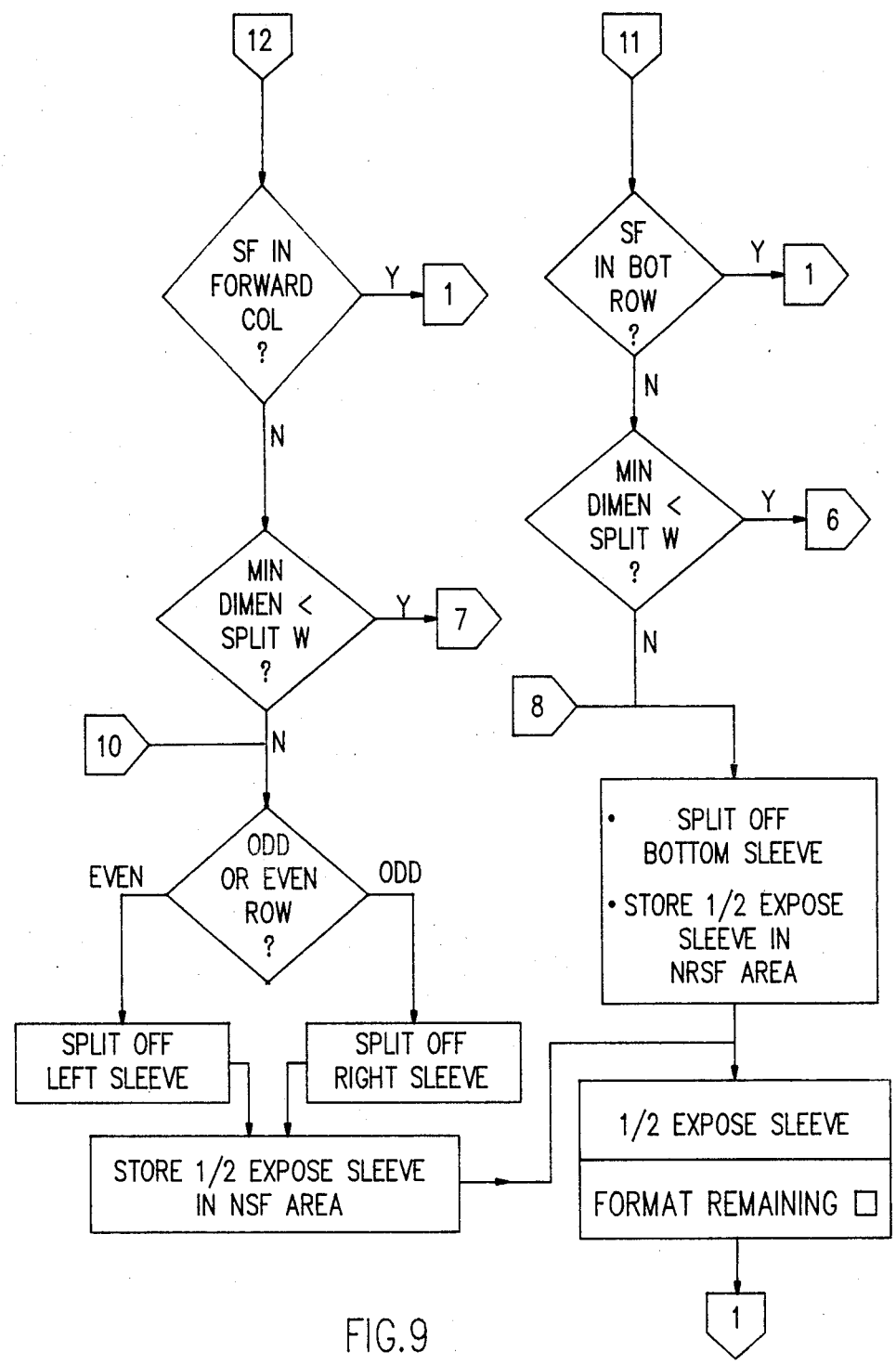

If the rectangle tests in FIG. 6 as a bottom interior rectangle, then the system must go to test whether the sub-field is in the bottom row as directed by the offpage indicator 11, which leads to FIG. 9. Referring to offpage indicator 11 in FIG. 9 the test made is:

(SF) IN BOTTOM ROW?

YES: The system follows offpage connector 1 to branch onto FIG. 6, as described above.

NO: The system leads to the next test as follows:

MINIMUM DIMENSION LESS THAN SPLIT WIDTH?

YES: If the minimum dimension is less than the split width of a sleeve, then the system branches via offpage connector 6 in FIG. 6 leading to half exposing, etc.

NO: If the minimum dimension of the sub-field in the bottom row is not less than the split width of a sleeve, then the program progresses to split off the bottom sleeve, etc.

Note that offpage connector 8 from FIG. 8 joins the program at this point.

SPLIT OFF BOTTOM SLEEVE

At this point, a sleeve is split away from the rectangle in the Sub-Field in the bottom row, as explained above.

STORE HALF EXPOSED SLEEVE IN NEXT ROW SUB-FIELD NRSF MEMORY

The spliced sleeve which has just split off is now directed to the NRSF memory 133 in FIG. 13 for storage for the computation in the next forward sub-field. Note that at this point, the program receives an input from the branch leading down from offpage connector 12 in FIG. 9.

HALF EXPOSE SLEEVE

The sleeve also remains in the current Sub-Field and it is half exposed.

FORMAT REMAINING RECTANGLE

The remaining rectangle which has not been split off as a sleeve is now to be exposed, but first it is formatted.

The formatted remaining rectangle is returned by offpage connector 1 to the fully exposing program steps in FIG. 6.

FORWARD INTERIOR (FI) CASE

Referring again to FIG. 6, if the rectangle falls into the FI category, then the program leads by offpage indicator 12 in FIG. 6. to FIG. 9 again.

SUB-FIELD IN FORWARD COLUMN?

Next, the program tests to determine whether the rectangle in this Sub-Field extends into the forward column.

YES: If YES, then the system branches to the offpage connector 1 in FIG. 6, and that routine is performed as described above.

NO: If NO, then the next test follows.

MINIMUM DIMENSION LESS THAN SPLIT WIDTH?

Following the NO answer, the rectangle is tested to determine whether the rectangle is wide enough to have a sleeve.

YES: If the answer is YES in that sleeve test, then the system branches to offpage connector 7 leading to FIG. 6, as described above in connection with the FORWARD (F) CASE.

NO: If the answer is NO in that sleeve test, then the system continues to the next routine.

Note that offpage connector 10 connects here also, from FIG. 8.

ODD OR EVEN ROW?

Since the scanning of the rows is alternately from left to right and right to left, the system must determine whether an odd or an even row is being traversed.

ODD: If the row is odd, then the system splits off a right sleeve.

EVEN: If the row is even, then the system splits off a left sleeve.

STORE HALF EXPOSED SLEEVE IN NEXT SUB-FIELD (NSF)

Regardless of whether the line is odd or even, the next step in the program is to store the half exposed sleeve in the NSF memory 120 for the next sub-field area, for processing next.

The program now leads to the Half Exposed Sleeve step as above in the right side of FIG. 9, as described just above.

Figure 10:
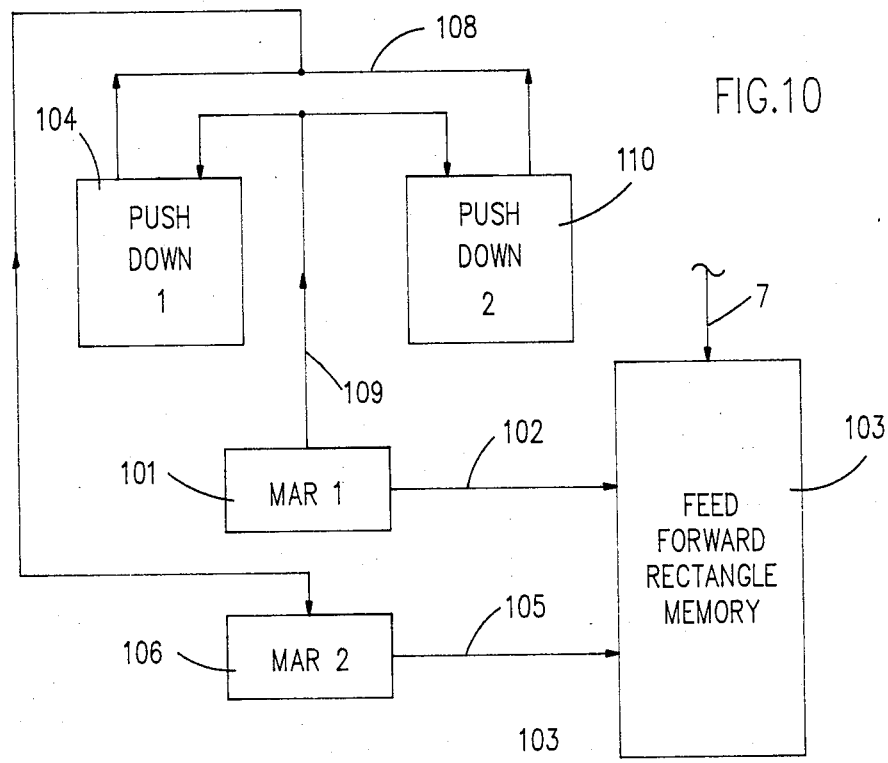
FIG. 10 shows the block diagram of the Feed Forward Buffer Memory in FIG. 1 for storing portions of the rectangles for the Next Row Sub-Field (NRSF) generated by the hardware pattern splicing unit of FIG. 1 in accordance with this invention.

FIG. 10 shows a block diagram of a buffer storage unit 8 shown in FIG. 1 for connection to the hardware half exposure splicing unit 6 in FIG. 1. The Feed Forward Buffer 8 receives rectangle data on line 7 which it stores in its feed forward rectangle memory 103. The portions of the half exposed data representing half exposed Next Row Sub-Field NRSF is "fed forward" to be stored for the reverse scan of the beam across the sub-fields as shown in FIG. 2 in the row below the row from right to left, and vice versa as the scans in reverse directions from left to right . . . then from right to left . . . and then from left to right again follow in succession. The half exposed data to be spliced into the next row below from NRSF memory 133 must be stored on a LIFO, (Last-In-First-Out) basis. Thus, the memory addresses from MAR1 are fed into push-down-1 memory stack 104 or push-down-2 memory stack 110 for odd or even rows respectively of scanning across the grid in FIG. 2. Assume in this case that we are in an odd row moving from left to right as in FIG. 2 so the memory addresses are being sorted in stack 104. Then the next sequential sub-field SF is exposed and the final MAR value is also pushed onto the stack 104, etc. until the entire row is exhausted. When the "fed forward" rectangles are needed for a SF in the next "even" row below, the MAR value is popped from the stack 104 into MAR2 106, which is used to access the data in memory 103 to be used for the current SF.

OPERATION

As a row of sub-fields is exposed, rectangles to be fed forward to the row below, i.e. NRSF sets of data, are put into the feed forward buffer memory 103 of the feed forward buffer 8 under the control of Input Memory Address Register MAR1. As each sub-field is completed by the hardware half exposure splicing system 6, the MAR1 value indicating the location of the NRSF data in the memory 103 is stored in a push down stack 104 for odd rows or a push down stack 110 for even rows.

FIG. 11 is a chart representing an example of twelve sub-fields which are to be scanned sequentially in accordance with this invention. FIG. 11 shows the organization needed for the twelve sub-fields with k=current column, j=current row, c=current sub-field, n=four columns, and m=three rows, with the scan from one to four reversing from right to left from five to eight and then reversing again from sub-field nine to twelve. The equation used to define the Next Row Sub-Field NRSF is as follows:

$$NRSF = i + 1 + 2(nj - i)$$

where
 $i$ = instant sub-field of m×n sub-fields
 $n$ = total number of columns k (e.g. 4)
 $j$ = row number of m rows (e.g. 1 to 3)

EXAMPLES

Assuming that we are in the fourth sub-field, then the number of columns is as always n=4, the row number j=1, and i=4. Thus $$NRSF = 4 + 1 + 2(4 \times 1 - 4) = 5 + 2(4-4) = 5 + 2(0) = 5$$

Assuming that we are in the sixth sub-field, then the number of columns remains n=4; the row number j=2, and of course i=6. Thus $$NRSF = 6 + 1 + 2(4 \times 2 - 6) = 7 + 2(8-6) = 7 + 2(2) = 7 + 4 = 11.$$

Assuming that we are in the eighth sub-field, then the number of columns remains n=4; the row number j=2, and of course i=8. Thus $$NRSF = 8 + 1 + 2(4 \times 2 - 8) = 9 + 2(8-8) = 9 + 2(0) = 9.$$

FIG. 12 illustrates the NSF feed forward storage memory 120 which stores the data representing the rectangle to be supplied for the Next Sub-Field NSF, with wrap around addressing. In this case, the number $4_3$ in memory 120 indicates the feed forward data for the spliced rectangle for Sub-field 4 in FIG. 11, and the subscript "3" refers to the source which is the half exposure calculation for current Sub-Field 3.

FIG. 13 shows the sequence of the Next Row Sub-Field (NRSF) rectangles stored in the feed forward buffer memory 133. The first portion of memory 133 contains a set of data designated as 81 indicating that it is to be used for sub-field 8 and originates from half exposure for sub-field 1. That memory is followed by 72, 63, 54, 125, 116, 98; and finally 169, where the NRSF data for sub-field 16 is obtained from sub-field 9, assuming that there are four more sub-fields in the row below sub-fields 9 to 12. Note that memory 133 uses wrap-around addressing.

FIG. 14 shows a case logic table for the various cases of the rectangle as illustrated in FIG. 5 and discussed above. This is based also on the Sub-Field Coordinate system which is 3000 units square with the origin at the center of the square coordinate system shown in FIG. 15. There is a margin with a width of 200 units about the square. The limits shown at the bottom are x=−1300 and x=+1300 and y=−1300, which are the values which relate to the typical rectangle with a width of w and a height of h, with the lower left corner defined as being at coordinates $x_o$, $y_o$. The Boolean logic table in FIG. 14 describes the AND, OR and inverter logic for the cases described above in connection with FIGS. 5 and 6. For example, the case of Interior is described in some detail.

See FIG. 16, where two AND circuits 161 and 162 are inputs to an OR circuit 163. The first AND 161 has inputs PQR and G which can be seen in the top row of table with the "1's" for columns P, Q and R and the "1" in the G row beneath the upper I in the case square. See the intersection between the first row and the G "1" column.

The second AND 162 has its intersection between the bottom row for column S where a "1" appears and column P where a "0" appears, necessitating inverter 164 and again the G row where a "1" appears intersecting at the lower I in the case square. The matrix of FIG. 14 is based on tests such as Col. 1, where the question is, IS THIS AN ODD ROW? If the answer is Yes, as in rows 1–3, a "1" appears. If not, then a "0" appears. The other tests are for whether $x_o < +1300$. The answers for the various cases are shown in column 2. Where the dash appears, it is not relevant to the particular case. Thus, that line would not connect to the gates for that case. The next test is whether $x_o + w < +1300$, where w is the width of the rectangle in FIG. 15. In other words, the system asks the question . . . Is the lower left corner of the rectangle in question inside the right margin limit along the x axis in FIG. 15? If yes, then a pair of "1's" in rows 1 and 2 from the top combined with a "1" for H, relating to height of the rectangle being below the lower limit at $-1300$ combine for the bottom-interior (BI) and bottom-interior-forward-corner (BIFC) cases, if it is an odd row and the differentiation is provided by the test for whether the origin plus the width w are less than the value $+1300$ for the BI case, whereas the reverse is true for the BIFC case. It is believed that the remaining cases can be worked out from the table without drawing all of the Boolean circuits and equations which are well known to those skilled in the art.

INDUSTRIAL APPLICABILITY

This invention is applicable in the manufacture of devices such as electronic, VLSI chips for applications such as large scale electronic systems such as large scale computers and other data processing equipment.

What is claimed is:

1. A system for scanning an electron beam in a predetermined pattern over a surface of a workpiece, said surface being partitioned into a matrix of sub-fields, said system including
    a. an electron beam exposure system including an electron beam,
    b. means for storing pattern data and means for determining the pattern boundary portions of said predetermined pattern in a currently selected sub-field of said matrix of sub-fields,
    c. splicing means for splicing said pattern data to provide spliced pattern data including means for partially exposing said pattern boundary portions in said currently selected sub-field with said pattern data, and partially exposing the boundary portions of said adjacent sub-fields which extend into said currently selected sub-field,
    d. means for operating said electron beam exposure system to expose said spliced pattern data on said workpiece, and
    e. said exposure system being connected to the output of said means for operating.

2. A system in accordance with claim 1 wherein said sub-fields include a selected sub-field and adjacent sub-fields located adjacent to said selected sub-field, where said adjacent sub-fields are to be exposed subsequently, said splicing means including means for determining the boundary portions of said predetermined and for partitioning and segregating the boundary portion in a selected sub-field of said matrix which extends into the next sequential adjacent sub-fields in the same row and column as said selected sub-field.

3. A system in accordance with claim 1 wherein said sub-fields include a selected sub-field and adjacent sub-fields located adjacent to said selected sub-field, where said adjacent sub-fields are to be exposed subsequently, said splicing means including means for storing said spliced pattern data to be fed forward to said adjacent sub-fields of the pattern boundary portion in said selected and said adjacent sub-fields in a memory.

4. A system in accordance with claim 1 wherein said splicing means includes
    means for providing spliced pattern data for scanning said electron beam over said surface of said workpiece to fully expose said surface with all portions of said predetermined pattern within said selected sub-field except said boundary portions.

5. A system in accordance with claim 1 wherein said splicing means includes
    means for providing spliced pattern data for partially exposing said boundary portions in a currently selected sub-field with said pattern data, and partially exposing the boundary portions of adjacent sub-fields which extend into said currently selected sub-field.

6. A system in accordance with claim 1 including
    a. memory means for storing pattern data representing at least one post processed pattern shape,
    b. said means for storing pattern data being coupled to the output of said memory means,
    c. said splicing means including
        (1) means for receiving said pattern data from said means for storing,
        (2) means for determining whether a splicing function is required on said pattern data, and
        (3) output means for preparing said spliced pattern data,
    d. said means for operating receiving said spliced pattern data from said output means and supplying said spliced pattern data to control exposure with an E-beam system.

7. A system for scanning an electron beam in a predetermined pattern over a surface, said surface being partitioned into a matrix of sub-fields, said system including
    a. an electron beam,
    b. means for determining the boundary portions of said predetermined pattern in a currently selected sub-field of said matrix which extends into the next sequential adjacent sub-fields in the same row and column as said selected sub-field;
    c. means for storing the pattern data to be ,fed forward to adjacent sub-fields of the pattern boundary portion in said selected and said adjacent sub-fields in a memory;
    d. means for scanning said electron beam over said surface to fully expose said surface with all portions of said predetermined pattern within said selected sub-field except the boundary portions; and e. means for partially exposing said boundary portions in said currently selected sub-field with said pattern data, and partially exposing the boundary portions of said adjacent sub-fields which extend into said currently selected sub-field.

8. A system in accordance with claim 7 including means for deleting from said memory the coordinates of said pattern boundary portions in said currently selected subfield, selected previously.

9. A system in accordance with claim 7 wherein means for partially exposing said boundary portions include means for storing data to be fed forward for computation of the data for said adjacent sub-fields.

10. A system for scanning an electron beam in a predetermined pattern over a surface, said surface being partitioned into a matrix of sub-fields, said sub-fields including boundary portions of said pattern which lie within two or more adjacent sub-fields, said system comprising:

a. feed-forward memory means for storing the coordinates of the boundary portions of said pattern in a selected sub-field which are to be partially exposed by said electron beam during the scanning of a subsequently selected sub-field, b. means for storing the coordinates of the boundary portions of said pattern in a previously selected sub-field which extends into the currently selected sub-field, wherein said coordinates of said previously selected pattern boundary portions are deleted from said feed-forward memory means following the scanning of the currently selected sub-field.

11. A method for scanning an electron beam in a predetermined pattern over a surface, said surface being partitioned into a matrix of sub-fields, said method comprising the steps of:

a. determining the boundary portions of said predetermined pattern in a currently selected sub-field of said matrix which extends into the next sequential adjacent sub-fields in the same row and column as said selected sub-field;

b. storing the coordinates of said pattern boundary portion in said selected and said adjacent sub-fields in a memory means;

c. scanning said electron beam over said surface to fully expose said surface with all portions of said predetermined pattern within said selected sub-field except said boundary portions; and d. partially exposing said boundary portions in said currently selected sub-field, and partially exposing the boundary portions of said adjacent sub-fields which extend into said currently selected sub-field.

12. A method in accordance with claim 11 including the step following step (d) of then deleting from said memory the coordinates of said pattern boundary portions in said selected currently selected sub-field, selected previously.

* * * * *

UNITED STATES PATENT AND TRADEMARK OFFICE
CERTIFICATE OF CORRECTION

PATENT NO. : 4,816,692

DATED : March 28, 1989

INVENTOR(S) : John R. Rudert, Jr.

It is certified that error appears in the above-identified patent and that said Letters Patent is hereby corrected as shown below:

The sheet of Drawing consisting of Figs. 14, 15 and 16 should be added as shown on the attached sheet.

Signed and Sealed this

Twenty-ninth Day of September, 1992

Attest:

DOUGLAS B. COMER

Attesting Officer      Acting Commissioner of Patents and Trademarks

X TESTS

| ODD ROW | $X_0 < +1300$ | $X_0 + W < +1300$ | $X_0 > -1300$ | $X_0 + W < -1300$ | | | | | |
|---|---|---|---|---|---|---|---|---|---|
| 1 | 1 | 1 | – | – | I | BI | B | | |
| 1 | 1 | 0 | – | – | FI | BIFC | BC | | |
| 1 | 0 | – | – | – | F | FC | C | | |
| 0 | – | – | 0 | 0 | FI | BIFC | BC | | |
| 0 | – | – | 0 | 1 | F | FC | C | | |
| 0 | – | – | 1 | – | I | BI | B | | |
| P | Q | R | S | T {G | 1 | 0 | 0 | $Y_0 > -1300$ |
|   |   |   |   |  {H | – | 1 | 0 | $Y_0 + H > -1300$ |

Y TESTS